(12) United States Patent
Schwarzl

(10) Patent No.: US 6,925,002 B2
(45) Date of Patent: Aug. 2, 2005

(54) SEMICONDUCTOR MEMORY HAVING MUTUALLY CROSSING WORD AND BIT LINES, AT WHICH MAGNETORESISTIVE MEMORY CELLS ARE ARRANGED

(75) Inventor: Siegfried Schwarzl, Neubiberg (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/815,840

(22) Filed: Apr. 2, 2004

(65) Prior Publication Data
US 2004/0218441 A1 Nov. 4, 2004

Related U.S. Application Data

(63) Continuation of application No. PCT/DE02/03491, filed on Sep. 17, 2002.

(30) Foreign Application Priority Data
Oct. 9, 2001 (DE) .......................... 101 49 737

(51) Int. Cl.[7] ............................................. G11C 11/00
(52) U.S. Cl. ...................................... 365/158; 365/157
(58) Field of Search ................................ 365/158, 145, 365/148, 157, 117

(56) References Cited

U.S. PATENT DOCUMENTS

| | | | |
|---|---|---|---|
| 5,477,482 A | 12/1995 | Prinz | |
| 5,534,355 A | 7/1996 | Okuno et al. | |
| 5,600,297 A | 2/1997 | Ruigrok et al. | |
| 5,623,436 A | 4/1997 | Sowards et al. | |
| 5,640,343 A | 6/1997 | Gallagher et al. | |
| 5,661,062 A * | 8/1997 | Prinz | 438/3 |
| 5,982,660 A | 11/1999 | Bhattacharyya et al. | |
| 6,359,829 B1 | 3/2002 | Van Den Berg | |
| 6,381,170 B1 * | 4/2002 | Prinz | 365/171 |
| 6,490,192 B2 | 12/2002 | Thewes et al. | |
| 6,512,688 B2 | 1/2003 | Thewes et al. | |
| 6,525,978 B2 | 2/2003 | Weber et al. | |
| 2002/0154537 A1 | 10/2002 | Schwarzl et al. | |

FOREIGN PATENT DOCUMENTS

EP 0 904 823 A3 3/1999

OTHER PUBLICATIONS

Tehrani, S. et al., "High Density Nonvolatile Magnetoresistive RAM", IEDM 96–193, IEEE 1996, pp. 7.7.1.–7.7.4, Tempe, AZ.

* cited by examiner

*Primary Examiner*—Thong Q. Le
(74) *Attorney, Agent, or Firm*—Edell, Shapiro & Finnan, LLC

(57) ABSTRACT

In the memory cell array of a semiconductor memory the memory elements or memory cells with a magnetoresistive effect can have a hard-magnetic memory layer and a soft-magnetic sensor layer. The magnetization axis of the hard-magnetic layer lies parallel to the line connected thereto, and the magnetization axis lies parallel to the line connected thereto. By an AC voltage or AC current source, a voltage or current signal is impressed on a respective selected line. The magnetization direction of the soft-magnetic layer is sinusoidally deflected from the easy magnetization axis. In addition to the impressed signal, the magnetoresistive resistance of the memory cell also changes as a result. Depending on the magnetization direction of the hard-magnetic layer, the signal is modulated in-phase or in-antiphase by the variable resistance. The sign supplies the memory information.

32 Claims, 5 Drawing Sheets

SEMICONDUCTOR MEMORY HAVING MUTUALLY CROSSING WORD AND BIT LINES, AT WHICH MAGNETORESISTIVE MEMORY CELLS ARE ARRANGED

CROSS REFERENCE TO RELATED APPLICATIONS

This application is a continuation of PCT Application No. PCT/DE02/03491, filed on Sep. 17, 2002, and titled "Semiconductor Memory Having Mutually Crossing Word And Bit Lines, At Which Magnetoresistive Memory Cells Are Arranged," which claims priority from German Patent Application No. DE 10149737.7, filed on Oct. 9, 2001, and titled "Semiconductor Memory Having Mutually Crossing Word And Bit Lines, At Which Magnetoresistive Memory Cells Are Arranged," the entire contents of which are hereby incorporated by reference.

FIELD OF THE INVENTION

The present invention relates to a semiconductor memory having mutually crossing word and bit lines, at which magnetoresistive memory cells are arranged and to a method and a circuit arrangement for evaluating the information content of the memory cell.

BACKGROUND

Nonvolatile memory cells with a magnetoresistive resistance, also called MRAM memory cells, usually have a layer sequence that includes a combination of ferromagnetic materials and an insulator layer respectively situated in between. The insulator layer is also referred to as a tunnel dielectric. In this case, the memory effect resides in the magnetically variable electrical resistance of the memory cell or memory cells.

The ferromagnetic materials have a magnetization axis per layer. The axes are arranged parallel to one another, thus resulting in two possible settings of the magnetization direction per layer. Depending on the magnetization state of the memory cell, the magnetization directions in the magnetic layers may be oriented in a parallel or antiparallel fashion. Depending on the relative orientation with respect to one another, the memory cell has a different electrical resistance. In this case, a parallel magnetization direction leads to a lower electrical resistance in the memory cell, while an antiparallel magnetization direction leads to a higher resistance.

The layers are generally embodied such that only one of the two ferromagnetic layers changes its magnetization state under the influence of an induced magnetic field, while the other layer has a time-invariant state, i.e., it serves as reference magnetization direction for the cell.

The insulator layer may have, for example, a thickness of about 1 to 3 nm. The electrical conductivity through this layer system is substantially determined by a tunnel effect through the insulator layer. Variations in the tunnel insulator thickness lead to great variations in the conductivity since the insulator thickness has an approximately exponential influence on the tunneling current.

The process of writing to such a memory cell is effected by an electric current. For this purpose, the memory cell is constructed such that it has two mutually crossing electrical conductors, called word line and bit line hereinafter. A layer sequence including magnetic layers and tunnel dielectric layers as described above is, in each case, provided at the crossover point between the conductors. An electric current flows through the two conductors, and in each case generates a magnetic field. The magnetic field resulting from a superposition of these fields acts on the individual magnetic layers. If the magnetic field strength is sufficiently large in each case, the magnetic layers exposed to the field are subject to magnetization reversal.

There are many possibilities that can be used as read-out methods for evaluating the memory cell content. For example, it is possible to perform a direct evaluation of the cell resistance and, if appropriate, a subsequent comparison with a reference resistance for instance of another cell. In this case, however, the problem arises that the abovementioned variations in the tunnel oxide thickness even of adjacent cells can lead to parameter fluctuations which can outweigh the difference to be measured in the magnetoresistive resistance in the order of magnitude of 10–20%.

As an alternative, it is also possible to employ directly switching reading. In this case, during the current measurement for determining the memory cell resistance, the latter is impressed with such a high value that a magnetization reversal, i.e., a reprogramming, of the cell content is performed. In this case, if the current intensity changes on account of an altered resistance in the case of a known magnetization state of the cell, then the state before the current was connected in is known. The same applies correspondingly to the case where no change is present. However, the high cell resistances in the case of a low voltage give rise in this case to the disadvantage that the expected change in the current lies in the thousandth range, and is thus difficult to detect. Primarily, however, this reading method is destructive, i.e., in the case of a change in resistance, it is necessary to re-establish the memory cell content before the reading operation.

A further possibility is described in DE 199 47 118 A1. Two voltages are successively stored in each case in a capacitance, the values of which depend on the resistances in the memory cell before and after a programming or switching attempt. The voltages may in each case be defined with dedicated additional resistances in order, e.g., to enable a comparison in a differential amplifier. It is only in the event of a successful programming attempt that different voltages stored in the capacitances are obtained. In principle, however, a disadvantage arises in this case, too, namely that the original memory content has to be written in again as a result of destructive reading methods, and that time and energy have to be expended as a result of the complicated re-reading-in process. Furthermore, this solution has the disadvantage that although currents through nonselected word and bit lines can lead to a reduction of parasitic effects, the cell array size is inevitably limited thereby.

SUMMARY

A semiconductor memory with magnetoresistive memory cells and a method for operating the semiconductor memory which can enable fast, accurate and reliable evaluation of a memory cell or of a memory cell array while avoiding parasitic effects.

A semiconductor memory having mutually crossing word and bit lines, at which magnetoresistive memory cells are arranged, which in each case, can include a first magnetic layer having a first magnetization axis, an insulating layer arranged in between, and a second magnetic layer having a second magnetization axis. The first magnetic layer is formed from hard ferromagnetic material, and the second magnetic layer is formed from soft ferromagnetic material. The first and the second magnetization axis intersect when projected into a plane spanned by the word and the bit lines, and by a method for operating the semiconductor memory.

The magnetoresistive memory cells can include TMR elements (tunnel magnetoresistive) or GMR elements (giant magnetoresistive) or similar memory elements which are set up at crossover points of the word and bit lines in the memory cell array, in each case between the lines. According to the invention, these elements can include a hard-magnetic layer and a soft-magnetic layer separated, e.g., by a thin tunnel oxide barrier as an insulator layer. The hard-magnetic ferromagnetic layer can have a remanent magnetization, i.e., the remanence, when an externally applied magnetic field is switched off, i.e., a magnetic hysteresis is present.

The soft-magnetic ferromagnetic layer can be determined by narrow hysteresis curves, i.e., by a low remanence and a correspondingly small coercive field strength. Therefore, according to the invention, it does not serve like the hard-magnetic layer as a memory layer which can be changed over by application of a magnetic field, e.g., by current flow through word and/or bit line, but rather as a sensor layer for reading out the information stored in the hard-magnetic layer, i.e., the orientation of the (remanent) magnetization in said layer. A possible low remanent magnetization in the soft-magnetic layer can have relatively little influence on the read-out result. Therefore, changes in magnetization in the soft-magnetic layer due to external interference fields can have relatively little significance.

The magnetic layers can have uniaxial anisotropy, i.e., in each case, easy magnetization axes, which the present magnetization direction can point along the axis either in one direction or in the opposite direction thereto. According to the invention, the two axes of the two layers can intersect in a plane defined by the bit and word lines, i.e., in contrast to what is conventionally the case, do not lie parallel to one another. The axes can be perpendicular to one another. The magnetization axis of the soft-magnetic layer can be oriented such that the relevant magnetization direction can be influenced by the external magnetic field induced by a current flow, e.g., in the word line. The influencing can have deflection, i.e., rotation, of the magnetization direction in the soft-magnetic layer from the stable configuration along the magnetization axis. The magnetization direction can then form an angle with the easy or the hard magnetization axis, which can designate the unstable configuration of the magnetization.

In a refinement of the present invention, therefore, the magnetization axis of the soft-magnetic layer can be arranged relatively parallel to the connected word line. An oblique-angled arrangement can also be possible. A relatively perpendicular arrangement of the magnetization axis with respect to the word line can make it impossible to deflect the present magnetization in an angular direction with respect to the hard magnetization axis.

The invention can also function with an arrangement in which the above-mentioned bit lines and word lines can be reciprocally interchanged in terms of function.

The uniaxial anisotropy of the memory layer can be defined by deposition/heat treatment in the magnetic field and/or the form of the memory element. In particular, an antiferromagnet, as a pinning layer, can be not necessary.

The effect of the invention can be based on the detection of a different resistance in the memory element during the read-out of the information content depending on the magnetization direction in the hard-magnetic layer in the event of a current being impressed into, e.g., the word line with the consequence of a magnetic field change, which directly affects the magnetization direction of the soft-magnetic layer. The magnetization direction of the soft-magnetic layer is thereby deflected, i.e., either in a parallel direction or in an antiparallel direction relative to the magnetization direction of the hard-magnetic layer. The magnetoresistive resistance of the element, which can be determined by a current or voltage measurement, can change in accordance with the relative orientation.

Respectively, the current impressed via the word line can be varied with respect to time, i.e., as an AC current with the profile of a sine curve. The latter can generate an alternating magnetic field parallel to the hard magnetization direction of the sensor layer. As a result, the magnetization of the soft-magnetic layer can be deflected from the magnetization direction in phase with the magnetic field through an angle which may be, for example, at most 90°, in the case, of a parallel arrangement of magnetization axis of the soft-magnetic layer and the word line.

Since the change in magnetization in the hard magnetization direction can be linear and not hysteresis, the magnetization of the soft-magnetic layer and the external magnetic field can be in phase. The magnetization of the soft-magnetic layer likewise can change sinusoidally for field amplitudes below the saturation field strength (coercive force, anisotropy field strength), but can undergo transition to saturation for field amplitudes that exceed this force (see FIG. 3), thus resulting in a rectangular magnetization profile. The rectangular signal profiles can also be evaluated by the present invention, but the amplitude of the current or voltage signal to be measured can no longer be increased for magnetic field amplitudes that exceed this force.

Consequently, the magnetoresistive resistance $R_{MR}$ also changes with the frequency of the AC current, where:

$$R_{MR} = R_0 + \frac{1}{2}\Delta R(1 \pm \cos\alpha) = R_0 + \frac{1}{2}\Delta R(1 \pm \sin\varphi)$$

the signs + and − corresponding to the two possible states of the magnetization direction of the hard-magnetic layer. $\alpha$ is the angle formed by the magnetization directions of the hard- and soft-magnetic layers, $\phi=(\pi/2)-\alpha$ a is the phase angle of the external magnetic field, $\Delta R$ designates the difference in magnetoresistive resistance between states of parallel and antiparallel orientation of the magnetizations and typically lies in the range of values of from 10% to 30% of $R_{MR}$.

The retention of the memory information in the hard-magnetic layer can be ensured, if the field amplitude of the alternating field lies below the coercive force of the layer. Since the coercive force of the hard-magnetic layer can be relatively greater than the coercive force of the soft-magnetic layer, at which order of magnitude the field amplitude can be chosen, and since no further magnetic field acts on the memory element during the read-out method according to the invention, this condition can easily be realized.

The varying voltage or the varying current can be passed for read-out onto, for example, the presently selected word line and connected to the ground potential by additional resistance, which can be lower than the magnetoresistive resistance of the memory cell. For this purpose, the semiconductor memory can include corresponding AC voltage or current source. This choice of the additional resistance can ensure that the current flow or the voltage drop at the memory element has the least possible reaction upon the signal in the word line and in the memory element.

Due to the validity of the relationship $U_{MR}=I_{MR} \cdot R_{MR}$, the voltage $U_{MR}$ between word line and bit line that can be measured by a voltage measuring device in the semiconductor memory or the voltage present at the memory element can change with the variation of the current $I_{MR}$ through the memory element and with the change in the magnetoresistive resistance $R_{MR}$ of the selected memory element. However, these changes can be either in phase or that in phase depending on the parallel or antiparallel orientation of the magnetization. Consequently, different voltage signals can arise for each of the two orientation possibilities. An analogous relationship holds true for the case where the current through the memory element of the magnetoresistive memory cell can be measured by a current measuring device, e.g., at the bit line.

BRIEF DESCRIPTION OF THE FIGURES

The invention will now be explained in more detail using an exemplary embodiment with reference to a drawing, in which.

DETAILED DESCRIPTION

Figure 1:
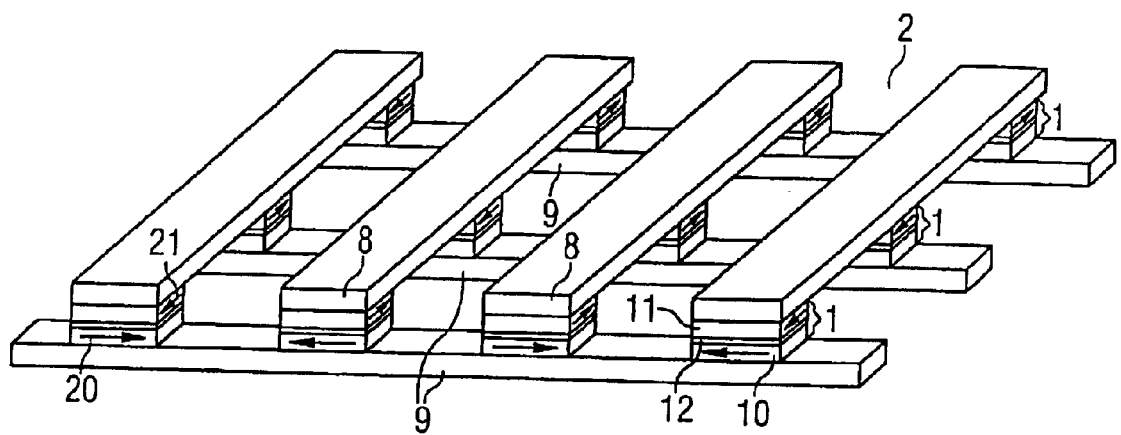
FIG. 1 shows an exemplary embodiment according to the invention of a memory cell array.

An arrangement according to the invention of memory cells 1 in a semiconductor memory 2, which are arranged between word lines 8 and bit lines 9, can be seen in FIG. 1. The memory cells 1 or memory elements with a tunnel magnetoresistive resistance (TMR elements) can include a hard ferromagnetic layer 10, an insulator layer 12, i.e., a tunnel oxide, and a soft ferromagnetic layer 11. The directions of the magnetization 20, 21 without magnetic fields acting can be respectively, parallel to the word and bit lines connected to the layer. The word lines 8 can be perpendicular to the bit lines 9 so that the magnetization axes 30, 31 of the hard and soft ferromagnetic layers 10, 11 can be perpendicular to one another. The axes can correspond to the present directions of the magnetization.

Information can be stored in the direction of the magnetization of the hard ferromagnetic layer 10. For example, a logic "1" can correspond to an orientation toward the left in FIG. 2b and a logic "0" can correspond to an orientation toward the right. The orientation 21 of the low magnetization in the soft ferromagnetic layer 11 can be in the current-free case and is not important initially for the memory information.

Figure 2A:
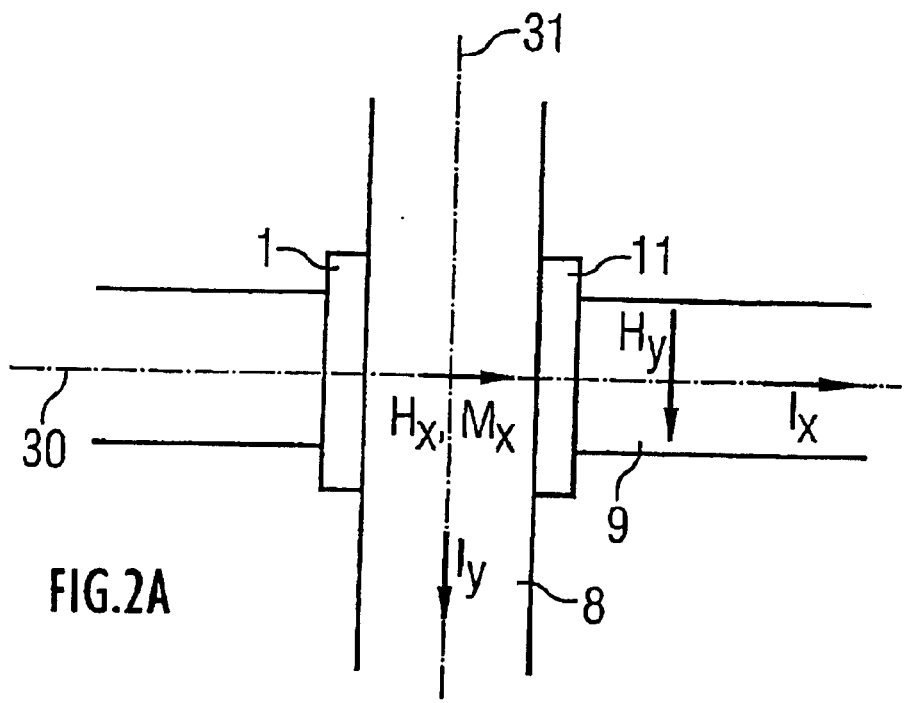
FIGS. 2A and 2B show the orientation of the magnetization axes and magnetic fields in a plan view of a memory cell, and the setting possibilities and also the deflection of the magnetization of the soft-magnetic layer in an oblique view, respectively.
Figure 2B:
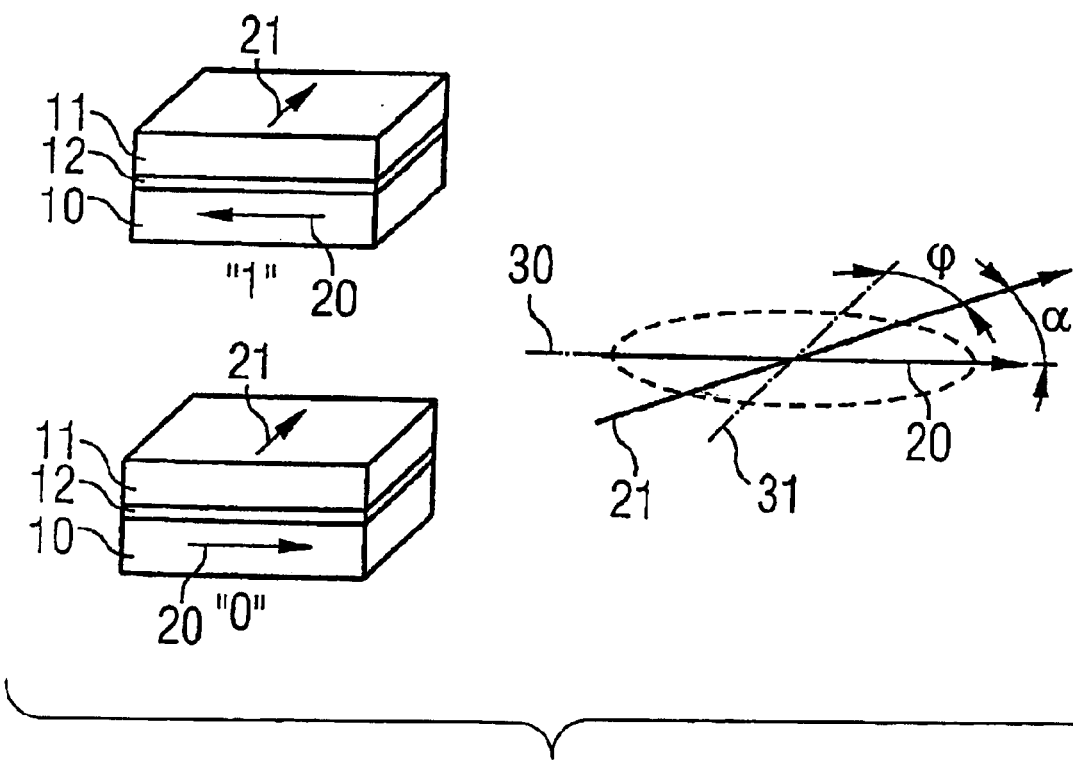

The influence of the AC current $I_y$ impressed into the word line 8 from an AC current source 50 for reading out the memory content can be illustrated in a plan view of one of the memory cells 1 in FIG. 2a. The orientation of the word line 8 is understood to be the y coordinate in this exemplary embodiment. The current flow $I_Y$ can generate a magnetic field $\overline{H}_X$ inter alia in the soft ferromagnetic layer 11 arranged below the word line 8 within the plan view. Since the magnetization axis 31 of the soft-magnetic layer 11 can lie parallel to the word line 8, the magnetic field direction can be perpendicular to the easy magnetization axis. The external magnetic field $\overline{H}_X$ can deflect the magnetization direction 21 of the soft-magnetic layer from the position of the easy magnetization axis 31 through the angle φ, as can be discerned in the diagrammatic oblique view on the right-hand side in FIG. 2b.

Figure 3:
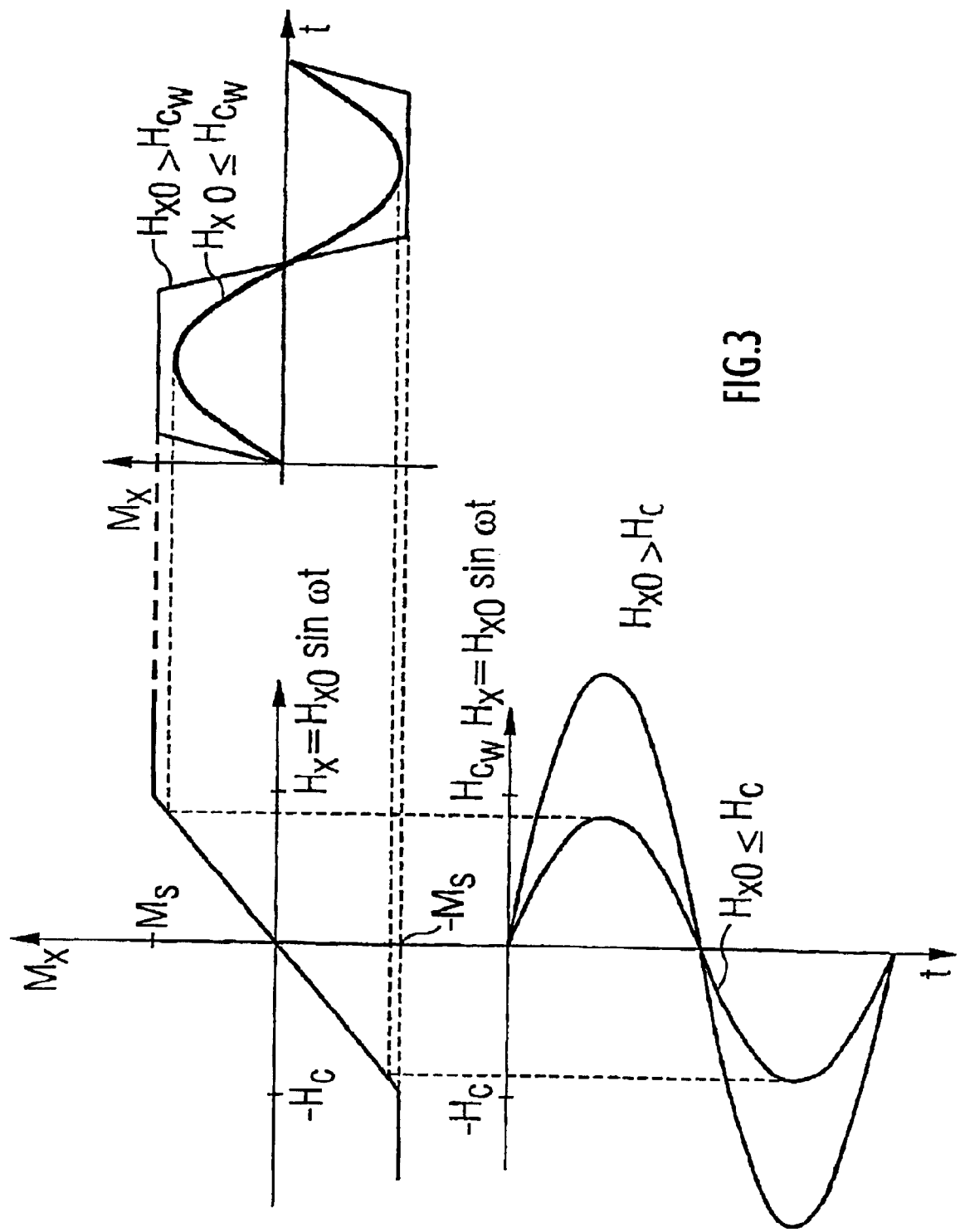
FIG. 3 shows a diagram for illustrating the mapping of the external varying magnetic field onto the magnetization of the soft-magnetic layer.

FIG. 3 shows the dependence of the hard magnetization component $M_X$ of the soft-magnetic layer that functions as a sensor layer on the sinusoidal alternating magnetic field $\overline{H}_X$ for two cases. In the first case (sine curve depicted bold), the amplitude $H_{X_0}$ of the magnetic field can be less than the coercive force of the soft-magnetic layer, $H_{X_0} = H_{C_W}$ i.e., equal to the anisotropy field strength given uniaxial anisotropy. The intensity of the deflection of the magnetization can then be sinusoidal.

In the second case (sine curve depicted thin), $H_{X_0} > H_{C_W}$ holds true, and the magnetization can reach saturation, thus giving rise to a rectangular magnetization profile.

Figure 4A:
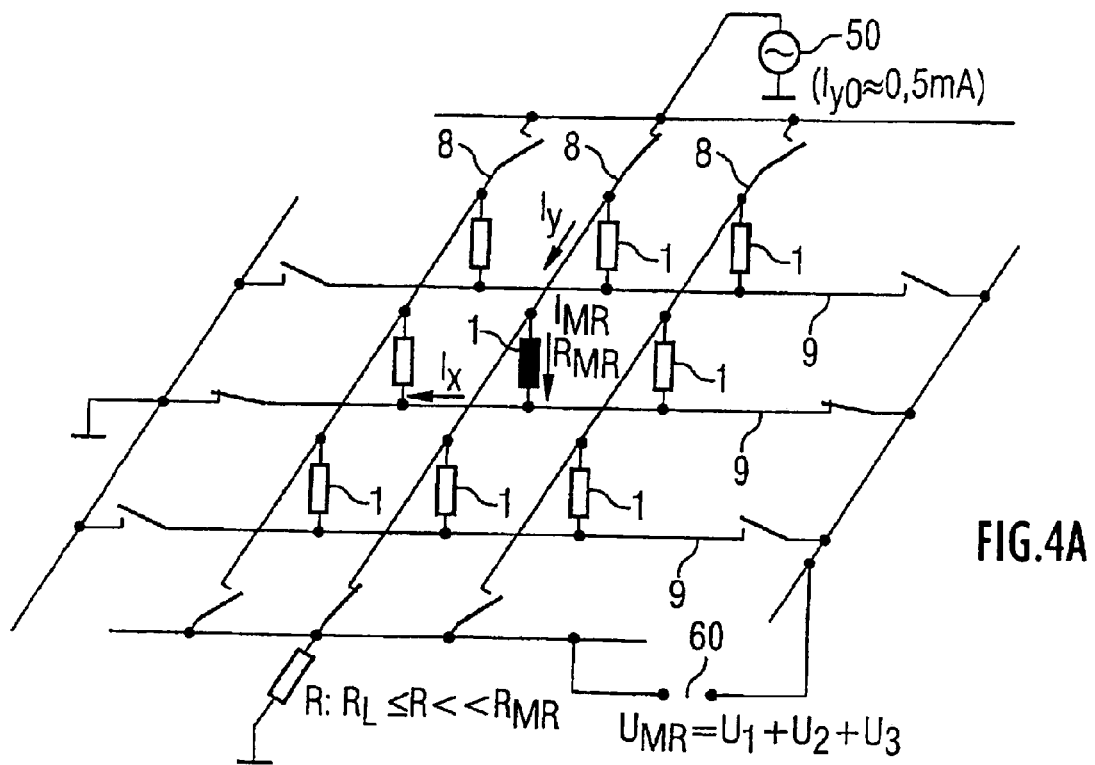
FIGS. 4A and 4B show a circuit diagram for an exemplary embodiment according to the invention with AC current fed into the word line and AC voltage fed in, respectively.

FIG. 4A illustrates a detail from the TMR cell array of the exemplary embodiment as a schematic circuit diagram. In order to write information to the memory, as in the case of the prior art, DC pulses having a sufficient magnitude and a defined direction are sent through the interconnects which cross one another at the selected element. A condition for writing is that the resultant magnetic field exceeds the switching threshold of the hard-magnetic layer.

The read-out of the information content of the selected memory cell can be effected by an AC current $$I_Y = I_{Y_0} \cdot \sin \omega t$$

with a constant amplitude $I_{Y_0}$ through the corresponding word line 8, and the analysis of the voltage between the word 8 and bit lines 9 that cross one another at the selected memory cell. The nonselected lines can be isolated both from the AC current source 50 and from the read-out electronics including a voltage measuring device.

The current $I_y$ can modulate the magnetization direction 21 of the soft-magnetic layer 11 so that the magnetoresistive resistance $R_{MR}$ can change sinusoidally with the varying angle between the magnetization directions 20, 21 of the soft-magnetic 11 and hard-magnetic 10 layers. The current $I_{MR}$ flowing through the memory element can be in a constant ratio to the impressed current $I_y$ if, e.g., the additional resistance shown at the bottom of FIG. 4A in the circuit can be taken into account with a suitable magnitude. The voltage dropped across the memory element can be $$U_{MR} = c \cdot I_Y \cdot R_{MR}$$

where $c \approx R_L/R_0$, with the exemplary values for the interconnect resistance $R_L \approx 1$ kΩ, and for the mean value of the magnetoresistive resistance $R_0 \approx 100$ kΩ.

The above equations yield $$U_{MR} = c \cdot I_{Y_0} \cdot \sin \omega t \cdot \left(R_0 + \frac{1}{2}\Delta R(1 \pm \sin \omega t)\right)$$

$$U_{MR} = cI_{Y_0} R_0 \sin \omega t + \frac{1}{2} cI_{Y_0} \Delta R \sin \omega t + \frac{1}{2} cI_{Y_0} \Delta R \sin^2 \omega t$$

Figure 5A:
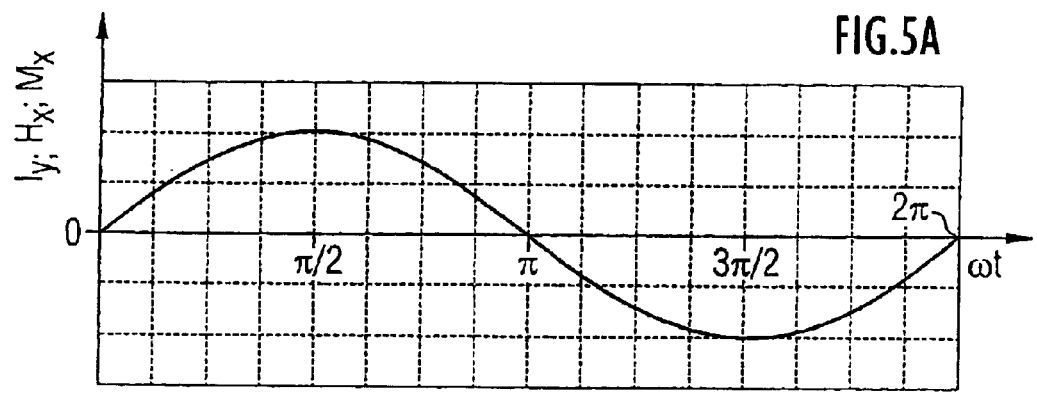
FIGS. 5A, 5B and 5C show an exemplary diagram for an AC voltage measured at the memory element, in which the voltage resulting from an AC current fed into the word line in accordance with the invention for two different orientations of the magnetization of the hard-magnetic layer.

-continued $$U_{MR} = U_1 + U_2 + U_3$$

with the three voltage components to be added:

$$U_1 = \pm \frac{c}{4} \cdot I_{Y_0} \cdot \Delta R$$

$$U_2 = c \cdot I_{Y_0} \left( R_0 + \frac{1}{2} \Delta R \right) \sin \omega t$$

$$U_3 = \mp \frac{c}{4} \cdot I_{Y_0} \cdot \Delta R \cdot \cos 2\omega t$$

which can respectively represent a constant voltage contribution $U_1$, the fundamental $U_2$ and a first harmonic $U_3$. The nonlinear magnetoresistive resistance can give rise to a rectifier effect, which can lead to a DC voltage component $U_1$ whose sign can depend on the magnetization direction 20 in the hard-magnetic memory layer 10 and thus on the stored information. The time and phase dependencies of the relevant quantities are illustrated for the case $H_{X_0} \leq H_{C_W}$ in FIG. 5.

Figure 5B:
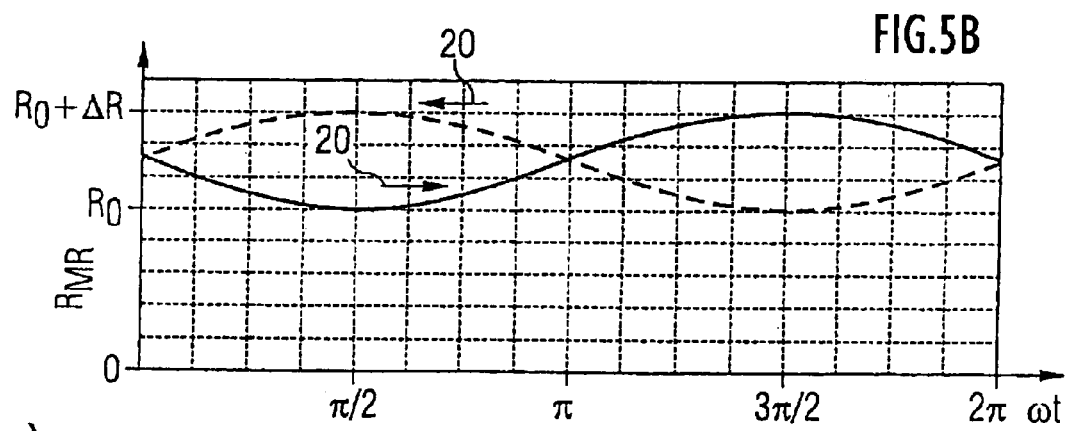
Figure 5C:
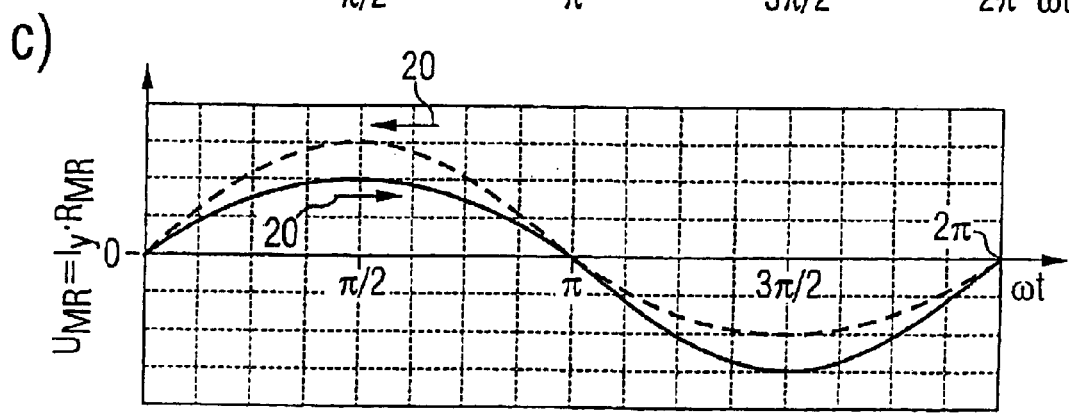

The voltage $U_{MR}$ present at the memory element can have different amplitudes in the first and second half-cycles. The sign of the resultant DC voltage component can be determined by the magnetization direction 20 in the hard-magnetic memory layer 10. This is illustrated in FIGS. 5B and 5C respectively, by the curve profiles depicted bold and thin. If a larger magnetic field $H_X$ where $H_{C_H} > H_{X_0} > H_{C_W}$ can be applied, $H_{C_H}$ being the coercive force of the hard-magnetic layer 10, then the magnetization component $M_X$ of the magnetization direction 21 of the soft-magnetic layer 11 can undergo transition to saturation in the X direction, that is to say in the direction of the bit line 9. A rectangular curve profile of the magnetization component $M_X$ and of the magnetoresistive resistance $R_{MR}$ can then arise, as described. In this case, the signal can be decomposed into a higher number of further harmonics. However, this rectangular profile or arbitrary other periodic alternating signals can also be evaluated in accordance with the invention.

The information content of the cell can be deduced by determining the sign of $U_1$. Knowledge of the average cell resistance $R_0$ and of the magnetoresistive resistance effect $\Delta R$ is not necessary. The voltage measuring device shown in FIG. 4A can be used for the detection in the exemplary embodiment.

The voltage component $U_2$ contains no information about the memory content of the memory cell 1.

By contrast, the first harmonic $U_3$ with twice the frequency compared to the fundamental again can contain a sign dependent on the magnetization direction 20 of the hard-magnetic layer 10. As in the case of $U_1$, knowledge of the average cell resistance $R_0$ and of the magnetoresistive resistance effect $\Delta R$ is not necessary. In accordance with the present invention, it suffices to establish the sign or the phase angle with respect to $I_y$.

With an impressed sinusoidal AC current having the amplitude $I_{y_0}=1$ mA and a ratio $\Delta R/R_0=20\%$, the following result for the components of the voltage drop:

$U_1$=50 mV
$U_2$=1.1 V
$U_3$=50 mV

Consequently, the magnitudes of the signals to be detected can be of the order of magnitude of 5% of the fundamental. Therefore, such a measurement can be relatively feasible.

The proportion of the DC voltage component $U_1$ can be separated from the AC voltage component $U_2$ by integration over a measurement duration of one or a few oscillation periods, or can be derived from the overall signal $U_{MR}$. At an AC current frequency of 100 MHz, the measurement duration can be 10 nanoseconds in the present exemplary embodiment. The measurement duration can be designed to be shorter by RC-minimized interconnects. On the other hand, the signal-to-noise ratio and thus the read-out reliability can be increased through longer integration times. Low-pass filters, amplifiers and/or comparators, for example, in the voltage measuring device for reading out the information content.

The first harmonic $U_3$ may be detected by phase-selective amplification, e.g., using a lock-in technique. This technique can provide high signal-to-noise ratios.

Figure 4B:
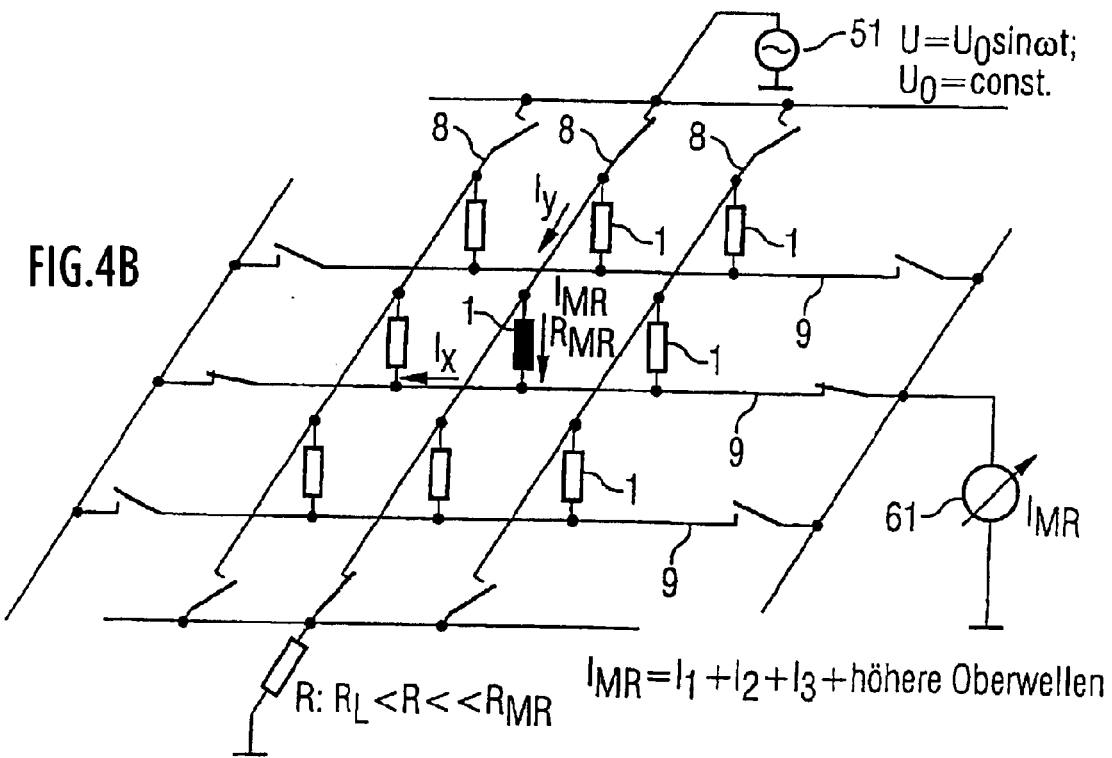

For a further exemplary embodiment analogous to the above exemplary embodiment, FIG. 4B illustrates a schematic circuit diagram of the semiconductor memory, in which a voltage source 51 can impress an AC voltage into the word line 8, while a current measuring device 61 can measure the current through the memory cell. In a similar manner to that in the case of the voltage signal, current terms including DC current, fundamental and harmonics result in this case, too, for the current signal to be measured, as in FIGS. 5A–5C. The DC current and harmonics terms are signed depending on the magnetization direction 20 of the hard-magnetic layer 10 and, in this exemplary embodiment, analogously to the above exemplary embodiment, can be read out, can be derived from the overall signal $U_{MR}$, for instance, by integration, low-pass filters, or comparators, and can beevaluated.

Parasitic effects can be precluded through coupling of the memory elements 1 in the resistance matrix of the memory cell array. Currents via shunt resistances can be reduced by the high resistances of the TMR elements.

To summarize, the following holds true for the present invention:

In the memory cell array of a semiconductor memory 2 the memory elements or memory cells 1 with a magnetoresistive effect can include a hard-magnetic memory layer 10 and a soft-magnetic sensor layer 11. The easy magnetization axes 30, 31 can intersect. The magnetization axis 30 of the hard-magnetic layer 10 can lie parallel to the line connected thereto, for instance, the bit line 9. The magnetization axis 31 of the soft-magnetic layer can lie parallel to the line connected thereto, for instance the word line 8. The axes with the respective parallel lines can be relatively perpendicular to one another.

By an AC voltage 51 or AC current source 50, a voltage or current signal can be impressed on a respective selected line, for instance, the word line 8. The magnetization direction 21 of the soft-magnetic layer 11 can be sinusoidally deflected from the easy magnetization axis 31. In addition to the impressed signal, the magnetoresistive resistance of the memory cell can also change as a result. Depending on the magnetization direction 20 of the hard-magnetic layer 10, an in-phase or in-antiphase superposition of signal and resistance can arise, so that, e.g., a signed DC voltage and a first harmonic can be detected as components from the signal. The sign can supply the memory information.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Memory cell, memory element
2 Semiconductor memory
8 Word line
9 Bit line
10 Hard-magnetic layer
Soft-magnetic layer
12 Insulator layer, tunnel oxide
20 Magnetization direction of the hard-magnetic layer
21 Magnetization direction of the soft-magnetic layer
30 Magnetization axis of the hard-magnetic layer
31 Magnetization axis of the soft-magnetic layer
50 AC current source
51 AC voltage source
60 Voltage measuring device
61 Current measuring device

I claim:

1. A semiconductor memory having mutually crossing word and bit lines at which magnetoresistive memory cells are arranged, comprising:
    a first magnetic layer having a first magnetization axis;
    a second magnetic layer having a second magnetization axis, wherein the first magnetic layer is formed from hard ferromagnetic material, the second magnetic layer is formed from soft ferromagnetic material, and the first and the second magnetization axes intersect if projected into a plane spanned by the word and the bit line;
    an insulating layer arranged in between the first and second magnetic layers; and
    a circuit arrangement for evaluating the information content of at least one of the magnetoresistive memory cells, the circuit arrangement including
        an AC current source connected to the memory cell via a word line; and
        a voltage measuring device measuring the voltage to the word line and to the memory cell, via a bit line, the memory cell being connected with a magnetoresistive resistance between the word and the bit line.

2. The semiconductor memory as claimed in claim 1, wherein the magnetoresistive resistance is based on the tunnel magnetoresistive effect of the combination of layer materials.

3. The semiconductor memory as claimed in claim 1, wherein the magnetoresistive resistance is based on the giant magnetoresistive effect of the combination of layer materials.

4. The semiconductor memory as claimed in claim 1, wherein the second magnetization axis of the second magnetic layer is arranged parallel to a first of the word or bit lines.

5. The semiconductor memory as claimed in claim 4, wherein the first magnetization axis of the first magnetic layer is arranged perpendicular to the second magnetization axis.

6. The semiconductor memory as claimed in claim 1, wherein the word line connected to the AC current source is connected to a ground potential via an additional resistance, and the resistance of the magnetoresistive memory cell has at least the magnitude of the additional resistance.

7. The semiconductor memory as claimed in claim 6, wherein the word line has an interconnect resistance, and the value of the additional resistance has at least the value of the interconnect resistance.

8. The semiconductor memory as claimed in claim 1, wherein the voltage measuring device has a unit for detecting a DC voltage component.

9. The semiconductor memory as claimed in claim 8, wherein the unit for detecting a DC voltage component has at least one of a low-pass filter, an amplifier, a comparator, and an integration unit.

10. The semiconductor memory as claimed in claim 1, wherein the voltage measuring device has a unit for the phase-selective measurement of voltage harmonics.

11. A semiconductor memory having mutually crossing word and bit lines at which magnetoresistive memory cells are arranged, comprising:
    a first magnetic layer having a first magnetization axis;
    a second magnetic layer having a second magnetization axis, wherein the first magnetic layer is formed from hard ferromagnetic material, the second magnetic layer is formed from soft ferromagnetic material, and the first and the second magnetization axes intersect if projected into a plane spanned by the word and the bit line;
    an insulating layer arranged in between the first and second magnetic layers; and
    a circuit arrangement for evaluating the information content of at least one of the magnetoresistive memory cells, the circuit arrangement including an AC voltage source connected to the memory cell via a word line, and a current measuring device for measuring the current flow between the bit line and a ground potential, one memory cell being connected with a magnetoresistive resistance between the word and the bit line.

12. The semiconductor memory as claimed in claim 11, wherein the word line connected to the AC voltage source is connected to a ground potential via an additional resistance, and the magnetoresistive resistance of the memory cell has at least the magnitude of the additional resistance.

13. The semiconductor memory as claimed in claim 12, wherein the word line has an interconnect resistance, and the additional resistance has at least the value of the interconnect resistance.

14. The semiconductor memory as claimed in claim 11, wherein the current measuring device has a unit for detecting a DC current component.

15. The semiconductor memory as claimed in claim 14, wherein the unit for detecting a DC current component has at least one of a low-pass filter, an amplifier, a comparator, and an integration unit.

16. The semiconductor memory as claimed in claim 11, wherein the current measuring device has a unit for the phase-selective measurement of current flow harmonics.

17. The semiconductor memory as claimed in claim 11, wherein the magnetoresistive resistance is based on the tunnel magnetoresistive effect of the combination of layer materials.

18. The semiconductor memory as claimed in claim 11, wherein the magnetoresistive resistance is based on the giant magnetoresistive effect of the combination of layer materials.

19. The semiconductor memory as claimed in claim 11, wherein the second magnetization axis of the second magnetic layer is arranged parallel to a first of the word or bit lines.

20. The semiconductor memory as claimed in claim 19, wherein the first magnetization axis of the first magnetic layer is arranged perpendicular to the second magnetization axis.

21. A method for operating a semiconductor memory for evaluating the information content of at least one of the magnetoresistive memory cells, the semiconductor memory having mutually crossing word and bit lines at which magnetoresistive memory cells are arranged, including a first magnetic layer having a first magnetization axis; a second magnetic layer having a second magnetization axis, wherein the first magnetic layer is formed from hard ferromagnetic material, the second magnetic layer is formed from soft ferromagnetic material, and the first and the second magnetization axes intersect if projected into a plane spanned by the word and the bit line; an insulating layer arranged in between the first and second magnetic layers; and a circuit arrangement for evaluating the information content of at least one of the magnetoresistive memory cells, the circuit arrangement including an AC voltage source connected to the memory cell via a word line, and a current measuring device for measuring the current flow between the bit line and a around potential, one memory cell being connected with a magnetoresistive resistance between the word and the bit line, the method comprising:

feeding an AC voltage having constant frequency and amplitude into the word line connected to the memory cell to be evaluated;

measuring a signal during a measurement duration, the signal being derived from the intensity of the current flow through the sequence of layers of the memory cell with a magnetoresistive resistance by the current measuring device; and evaluating the information content of the memory cell depending on the profile of the signal during the measurement duration.

22. The method as claimed in claim 21, wherein the signal derived from the measurement in the current measuring device includes the DC voltage component of the measured AC voltage profile, and the evaluation is carried out in a manner dependent on the sign of the DC voltage component.

23. The method as claimed in claim 21, wherein the signal derived from the measurement in the current measuring device includes the first harmonic of the AC voltage profile with double the AC voltage frequency fed in, and the evaluation is carried out in a manner dependent on the sign of the harmonic in the case of a predetermined phase.

24. The method as claimed in claim 23, wherein a phase-selective lock-in technique is used.

25. The method as claimed in claim 21, wherein the measurement duration is less than 20 nanoseconds.

26. The method as claimed in claim 21, wherein the AC voltage frequency is more than 100 megahertz.

27. A method for operating a semiconductor memory for evaluating the information content of at least one of the magnetoresistive memory cells, the semiconductor memory having mutually crossing word and bit lines at which magnetoresistive memory cells are arranged, including a first magnetic layer having a first magnetization axis; a second magnetic layer having a second magnetization axis, wherein the first magnetic layer is formed from hard ferromagnetic material, the second magnetic layer is formed from soft ferromagnetic material, and the first and the second magnetization axes intersect if projected into a plane spanned by the word and the bit line; an insulating layer arranged in between the first and second magnetic layers; and a circuit arrangement for evaluating the information content of at least one of the magnetoresistive memory cells, the circuit arrangement including an AC current source connected to the memory cell via a word line, and a voltage measuring device for measuring the voltage to the word line and to the memory cell, via a bit line, the memory cell being connected with a magnetoresistive resistance between the word and the bit line, the method comprising:

feeding an AC current having constant frequency and amplitude into the word line connected to the memory cell to be evaluated;

measuring a signal during a measurement duration, the signal being derived from the voltage between the bit and the word line by the voltage measuring device; and evaluating the information content of the memory cell depending on the profile of the signal during the measurement duration.

28. The method as claimed in claim 27, wherein the signal derived from the measurement in the voltage measuring device includes the DC current component of the measured AC current profile, and the evaluation is carried out in a manner dependent on the sign of the DC current component.

29. The method as claimed in claim 27, wherein the signal derived from the measurement in the voltage measuring device includes the first harmonic of the AC current profile with double the AC current frequency fed in, and the evaluation is carried out in a manner dependent on the sign of the harmonic in the case of a predetermined phase.

30. The method as claimed in claim 29, wherein a phase-selective lock-in technique is used.

31. The method as claimed in claim 27, wherein the measurement duration is less than 20 nanoseconds.

32. The method as claimed in claim 27, wherein the AC current frequency is more than 100 megahertz.

* * * * *